(12) United States Patent
Denta et al.

(10) Patent No.: US 9,064,818 B2
(45) Date of Patent: Jun. 23, 2015

(54) SEMICONDUCTOR DEVICE

(71) Applicant: FUJI ELECTRIC CO., LTD., Kawasaki-shi (JP)

(72) Inventors: Toshio Denta, Matsumoto (JP); Tomonori Seki, Azumino (JP); Tadanori Yamada, Matsumoto (JP); Tadahiko Sato, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/180,874

(22) Filed: Feb. 14, 2014

(65) Prior Publication Data
US 2014/0231975 A1    Aug. 21, 2014

(30) Foreign Application Priority Data
Feb. 15, 2013    (JP) ................. 2013-027960

(51) Int. Cl.
*H01L 23/495* (2006.01)
*H01L 23/31* (2006.01)
(Continued)

(52) U.S. Cl.
CPC ... *H01L 23/3114* (2013.01); *H01L 2224/32225* (2013.01); *H01L 2224/32245* (2013.01); *H01L 2224/48247* (2013.01); *H01L 2224/73265* (2013.01); *H01L 2224/85205* (2013.01); *H01L 2924/1203* (2013.01); *H01L 2924/13055* (2013.01); *H01L 23/057* (2013.01); *H01L 23/13* (2013.01); *H01L 23/24* (2013.01); *H01L 23/3735* (2013.01); *H01L 23/49548* (2013.01); *H01L 24/32* (2013.01); *H01L 24/48* (2013.01); *H01L 24/73* (2013.01); *H01L 24/85* (2013.01); *H01L 2924/1305* (2013.01)

(58) Field of Classification Search
CPC .............. H01L 23/3107; H01L 23/49575; H01L 23/495; H01L 23/49537; H01L 23/4951; H01L 23/3114; H01L 2224/48247; H01L 21/56; H01L 2924/13055; H01L 2924/01082; H01L 25/165
USPC .......... 257/177, 666, 687, 690, 692, E23.066, 257/667, 670, E23.01; 438/111, 123, 124, 438/125, 126
See application file for complete search history.

(56) References Cited

U.S. PATENT DOCUMENTS 5,519,252 A *    5/1996    Soyano et al. ................. 257/690
6,696,749 B1 *   2/2004    Hung et al. .................... 257/669
(Continued)

FOREIGN PATENT DOCUMENTS

JP    2000-236048 A    8/2000
JP    2000-332179      * 11/2000    .............. H01L 23/48
(Continued)

*Primary Examiner* — Khiem D Nguyen
(74) *Attorney, Agent, or Firm* — Manabu Kanesaka (57) ABSTRACT

A semiconductor device includes an insulating circuit substrate mounted with at least one semiconductor element; a resin case having a bottom surface portion attached with the insulating circuit substrate and a side surface portion enclosing a periphery of the bottom surface portion; a lead molded integrally with the resin case and provided on a periphery of the insulating circuit substrate to be positioned on a surface of the bottom surface portion inside the resin case, the lead partially extending from inside the resin case to outside the resin case; and a sealing resin filled inside the resin case. A depressed portion is formed on two sides of the lead along a peripheral edge of the bottom surface portion inside the resin case.

12 Claims, 5 Drawing Sheets

(51) Int. Cl.
  *H01L 23/057* (2006.01)
  *H01L 23/13* (2006.01)
  *H01L 23/24* (2006.01)
  *H01L 23/373* (2006.01)
  *H01L 23/00* (2006.01)

(56) References Cited

U.S. PATENT DOCUMENTS

| | | | |
|---|---|---|---|
| 6,696,753 B2 * | 2/2004 | Tokuhara | 257/692 |
| 7,671,467 B2 * | 3/2010 | Nonaka et al. | 257/711 |
| 7,986,531 B2 * | 7/2011 | Lee et al. | 361/752 |
| 2004/0102023 A1 * | 5/2004 | Morozumi et al. | 438/460 |
| 2008/0023721 A1 * | 1/2008 | Lee et al. | 257/99 |
| 2009/0294796 A1 * | 12/2009 | Morita et al. | 257/100 |

FOREIGN PATENT DOCUMENTS

| | | |
|---|---|---|
| JP | 2000-332179 A | 11/2000 |
| JP | 2008-288414 A | 11/2008 |
| JP | 2010-199166 A | 9/2010 |

* cited by examiner

SEMICONDUCTOR DEVICE

RELATED APPLICATIONS

The present application claims priority from Japanese Patent Application No. 2013-027960 filed Feb. 15, 2013.

BACKGROUND OF THE INVENTION

1. Field of the Invention

The present invention relates to a semiconductor device. In particular, the invention relates to a semiconductor device such that reliability is increased when a lead inside a resin case housing semiconductor elements is provided integrally with the resin case.

2. Description of the Background Art

A semiconductor module wherein a plurality of power semiconductor elements, such as an insulated gate bipolar transistor (IGBT) and free wheeling diode (FWD), are housed in a resin case is known as a semiconductor device that controls a motor, or the like.

In one example of this semiconductor module, power semiconductor elements are electrically connected via solder to an electrical circuit formed of a conductive layer of a surface of an insulating circuit substrate, and a lead in a resin case is provided integrally with the resin case by transfer molding. One portion of the lead protrudes through a side surface portion of the resin case to the outside of the resin case, and is connected to an external terminal. The electrical circuit and power semiconductor elements of the insulating circuit substrate housed inside the resin case are electrically connected to the lead inside the resin case with bonding wire. Also, a sealing resin is implanted into the resin case wired with the bonding wire, and moisture or the like is prevented by the sealing resin from entering into the resin case, thus protecting the power semiconductor elements and the like.

The resin case is made of a polyphenylene sulfide resin (a PPS resin), a polybutylene terephthalate resin (a PBT resin), a polyamide resin (a PA resin), an acrylonitrile butadiene styrene resin (an ABS resin), or the like, and the lead is formed of a conductive laminate of copper, or the like, or by applying a metal plating to a conductive laminate. It is not easy to bring the material of the resin case and the material of the lead into close contact. Consequently, a slight gap may occur between the lead, integrally molded with the resin case by transfer molding, and the resin case. When this gap is formed along the lead protruding from inside the resin case to the outer side, there is concern that moisture will infiltrate the resin case from the exterior, leading to a decrease in the reliability of the semiconductor module.

Also, it is not easy to closely contact the resin case and lead, so that, when a slight gap occurs between the lead and resin case, it is difficult to obtain a good joint when joining the bonding wire to the lead using an ultrasonic tool.

As a heretofore known resin sealed semiconductor device, there is a semiconductor device wherein, in order to prevent an ingress of moisture from a gap in the interface of an insulating resin package and a metal support plate, a ring-like groove portion is formed in the metal support plate, and the entrance of the ring-like groove portion is of a form shorter than a bottom edge portion (JP-A-2000-236048). Also, there is a semiconductor device wherein, in order to improve the adhesion between a lead frame and sealing resin, a silver plating coating such that crystal irregularities are formed is provided on a lead frame surface (JP-A-2010-199166). Furthermore, there is a semiconductor device wherein, by an internal terminal provided in the resin case, which is fixed by being sandwiched from a side surface to the upper surface of the internal terminal by a projection formed integrally with the resin case, reliability when bonding is increased (JP-A-2000-332179).

SUMMARY OF THE INVENTION

The semiconductor device described in JP-A-2000-236048 attempts to improve the adhesion of the interface between the metal support plate on which semiconductor elements are mounted and the insulating resin package, but does not prevent ingress of moisture from a gap between a lead provided integrally with a resin case and the resin case. Also, even when roughening the surface of the lead frame by plating, as described in JP-A-2010-199166, it is difficult to prevent ingress of moisture from a gap between a lead provided integrally with a resin case and the resin case, and to improve the adhesion between the lead and resin case. Also, with the semiconductor device described in JP-A-2000-332179, it is not easy to prevent ingress of moisture from a gap between a lead molded integrally with a resin case and the resin case.

The invention, in order to advantageously resolve the heretofore described problems, has an object of providing a semiconductor device wherein a lead is provided inside a resin case molded integrally with the resin case, such that it is possible to prevent an ingress of moisture from a gap between the lead and resin case, thus increasing the reliability of the semiconductor device.

In order to achieve the object of the invention, the following kind of semiconductor device is provided.

The semiconductor device includes an insulating circuit substrate mounted with at least one semiconductor element, a resin case having a bottom surface portion attached with the insulating circuit substrate and a side surface portion enclosing a periphery of the bottom surface portion, a lead molded integrally with the resin case and provided on a periphery of the insulating circuit substrate so as to be positioned in a surface of the bottom surface portion inside the resin case, the lead partially extending from inside the resin case to outside the resin case, and a sealing resin packed inside the resin case. A depressed portion is formed on two sides of the lead along a peripheral edge of the bottom surface portion inside the resin case.

Another aspect of the semiconductor device includes an insulating circuit substrate mounted with at least one semiconductor element, a resin case having a bottom surface portion attached with the insulating circuit substrate and a side surface portion enclosing a periphery of the bottom surface portion, a lead molded integrally with the resin case and provided on a periphery of the insulating circuit substrate so as to be positioned in a plane same as a surface of the bottom surface portion inside the resin case, the lead partially extending from inside the resin case to outside the resin case, and a sealing resin filled inside the resin case. A depressed portion is formed on two sides of the lead along a peripheral edge of the bottom surface portion inside the resin case, and a latch member of the lead is provided in a position other than that of the depressed portion.

According to the invention, as the depressed portion is formed on two sides of the lead along the peripheral edge of the bottom surface portion inside the resin case, it is possible to improve the adhesion between the resin case and sealing resin by the sealing resin entering the depressed portion. Because of this, it is possible to prevent ingress of moisture from the exterior to the interior of the resin case through a gap between the lead and resin case, and thus possible to increase the reliability of the semiconductor device.

DETAILED DESCRIPTION OF THE INVENTION

A specific description will be given, using the drawings, of embodiments of a semiconductor device of the invention.

Figure 1:
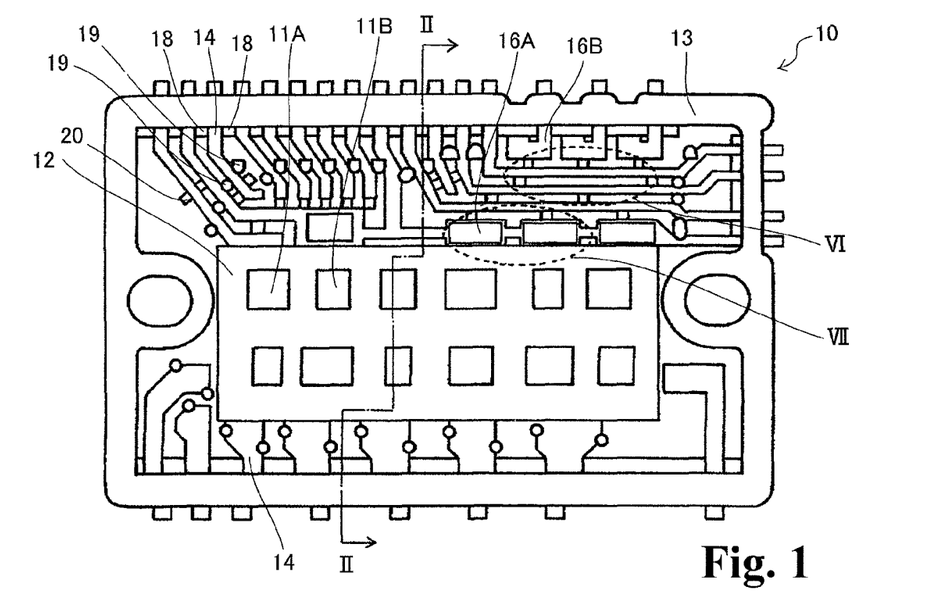
FIG. 1 is a plan view of one embodiment of a semiconductor device of the invention.
Figure 2:
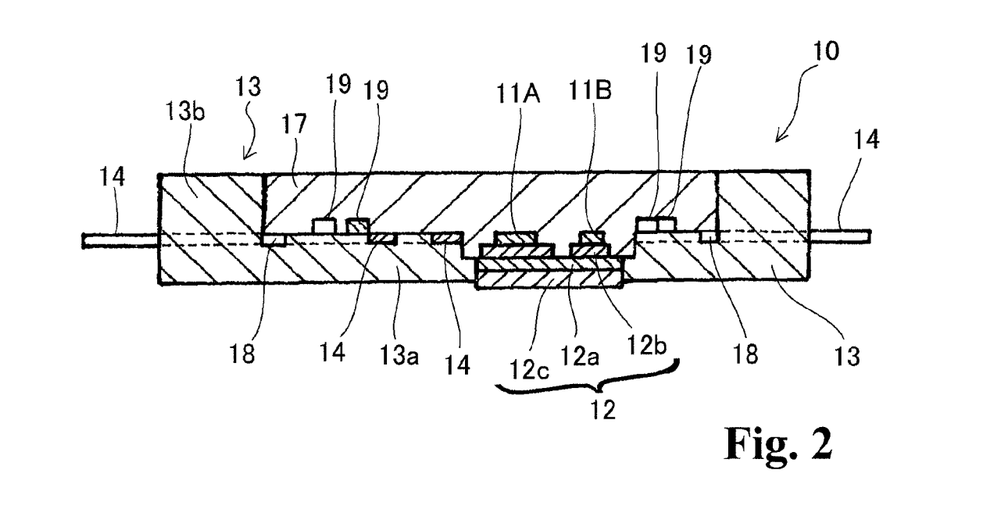
FIG. 2 is a sectional view taken along the line II-II of FIG. 1.

A semiconductor device 10 of one embodiment of the invention is shown as a plan view in FIG. 1 and as a sectional view taken along the line II-II of FIG. 1 in FIG. 2. The semiconductor device 10 of the embodiment of the invention is configured as a power semiconductor module, and is such that a plurality of semiconductor elements 11A and 11B is mounted on an insulating circuit substrate 12. The semiconductor elements 11A and 11B are an insulated gate bipolar transistor (IGBT) and free wheeling diode (FWD) respectively.

The insulating circuit substrate 12 is formed of an insulating layer 12a, and conductive layers 12b and 12c formed on one surface and the other surface respectively of the insulating layer 12a, as shown in the sectional view of FIG. 2. The semiconductor elements 11A and 11B are electrically connected with solder to the conductive layer 12b, on which a circuit pattern is formed, configuring an upper arm and lower arm respectively of, for example, a U-phase, V-phase, and W-phase as a main circuit of an inverter circuit.

The insulating circuit substrate 12 mounted with the semiconductor elements 11A, 11B is housed in a resin case 13. A lead 14 is provided inside the resin case 13. The semiconductor elements 11A, 11B and the conductive layer 12b of the insulating circuit substrate 12 are electrically connected with bonding wire to the lead 14. A depiction of the bonding wire is omitted from FIGS. 1 and 2 in order to facilitate understanding of the invention.

Figure 3:
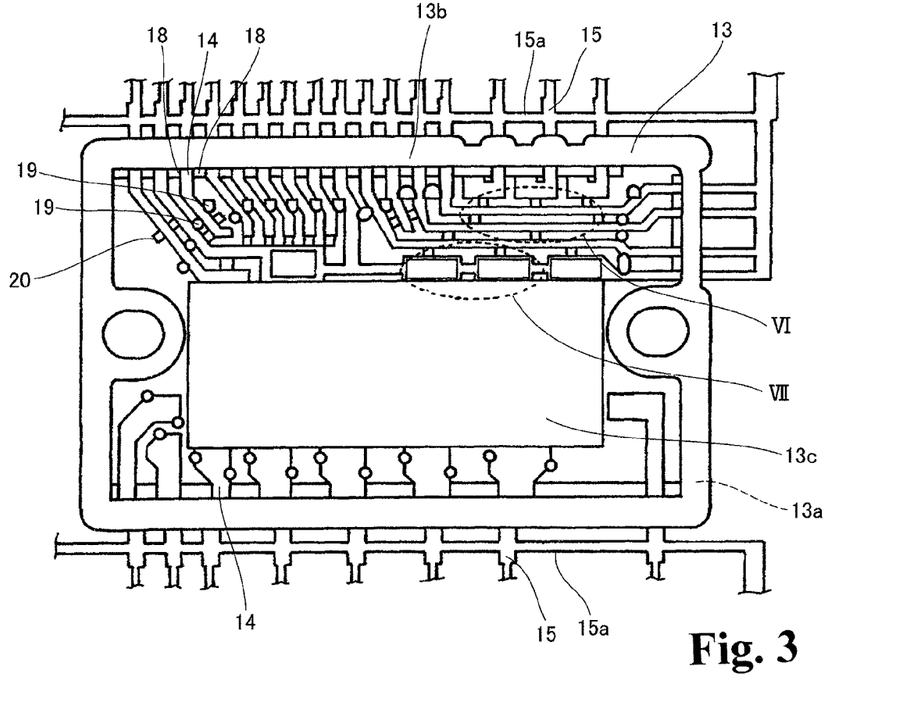
FIG. 3 is a plan view of a resin case and lead frame used in the semiconductor device of FIG. 1.

The lead 14 is molded integrally with the resin case 13, by transfer molding using a die, so as to be positioned on the same plane as the surface of a bottom surface portion 13a inside the resin case 13. FIG. 3 shows the resin case 13 with which a lead frame 15 is integrally molded. One portion of the lead 14 of the lead frame 15 penetrates a side surface portion 13b of the resin case 13, extending from inside the resin case 13 to outside the resin case 13. The lead frame 15 is placed in a die, and integrally molded with the resin case 13 by transfer molding. A tie bar 15a of the lead frame 15 is cut off after molding.

The resin case 13 has an approximately cuboid box form including the bottom surface portion 13a and the side surface portion 13b enclosing the periphery of the bottom surface portion 13a. The resin case 13 is preferably made of one kind of resin chosen from a polyphenylene sulfide resin (a PPS resin), a polybutylene terephthalate resin (a PBT resin), a polyamide resin (a PA resin), and an acrylonitrile butadiene styrene resin (an ABS resin). An aperture portion 13c is provided in the bottom surface portion 13a of the resin case 13 (refer to FIG. 3), and the insulating circuit substrate 12 is tightly installed in the aperture portion 13c.

Also, control circuit chips 16A and 16B for controlling the main circuit configured of the semiconductor elements 11A and 11B are provided on the lead 14.

Also, a sealing resin 17 formed of an epoxy resin, a silicone resin, a urethane resin, or the like, is injected into and hardened inside the resin case 13 after the bonding wire has been disposed, as shown in the sectional view of FIG. 2, thereby protecting the semiconductor elements 11A and 11B, lead 14, control circuit chips 16A and 16B, and the like, inside the resin case 13. In FIG. 1, the inside of the resin case 13 without the sealing resin 17 is shown in order to facilitate understanding of the invention.

The semiconductor device 10 of the embodiment is such that a depressed portion 18 is formed along the peripheral edge of the bottom surface portion 13a inside the resin case 13 on at least one side, preferably on both sides, of the lead 14. The depressed portion 18 can be formed by providing a protruding portion corresponding to the depressed portion on the die used when integrally molding the resin case 13 and lead 14 by transfer molding.

By the depressed portion 18 being formed on both sides of the lead 14 along the peripheral edge of the bottom surface portion 13a inside the resin case 13, preferably along the border of the bottom surface portion 13a and side surface portion 13b, it is possible to reduce the gap between the lead 14 and resin case 13. To explain the reason for this, while it is not easy to bring the lead 14 and resin case 13 into close contact, there is good adhesion between the resin case 13 and sealing resin 17. Therefore, by the depressed portion 18 being formed on both sides of the lead 14 in the resin case 13 bottom surface portion 13a, which is molded so as to be in the same plane as the surface of the lead 14, the contact area of the resin case 13 and sealing resin 17 increases in comparison with a case in which the depressed portion 18 is not formed, because of which the two are close contacting securely. In particular, as the depressed portion is formed on both sides of the lead 14, adhesion in both side portions of the lead 14 improves, because of which it is possible to reduce the gap between the lead 14 and resin case 13. Furthermore, by the depressed portion 18 being formed along the peripheral edge of the bottom surface portion inside the resin case 13, it is possible to prevent the ingress of moisture in positions distanced from the insulating circuit substrate 12 inside the resin case 13.

From the above, it is shown that it is possible to effectively prevent ingress of moisture into the resin case 13 from the exterior of the resin case 13 through the gap between the resin case 13 and lead 14.

The depth of the depressed portion 18, although depending on the size of the resin case 13, and the like, can be in the region of 0.3 to 0.5 mm, as one example. The width of the depressed portion 18 can be in the region of 1.0 mm.

Figure 4A:
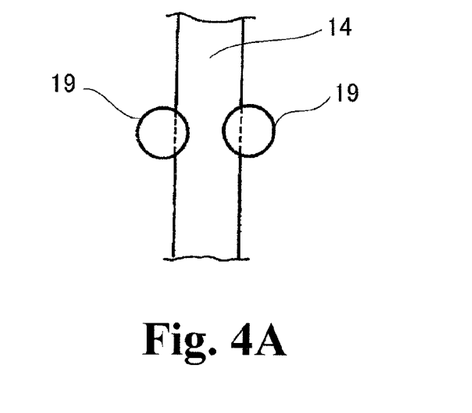
FIGS. 4A and 4B are illustrations of a latch member.
Figure 4B:
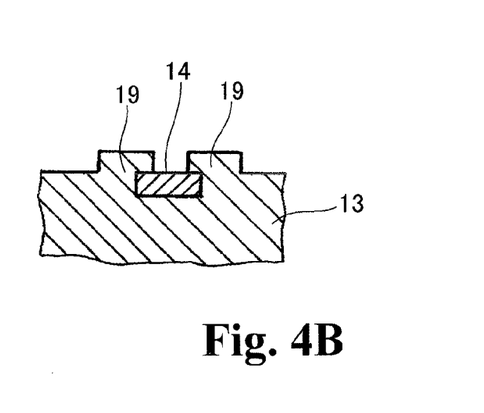

Next, a description will be given of another embodiment of the semiconductor device of the invention. In the embodiment, the depressed portion 18 is provided along the lead 14, and latch members 19 of the lead 14 are provided in positions other than that of the depressed portion 18, as shown in FIGS. 1 to 3. An enlarged plan view of the latch members 19 is shown in FIG. 4A, and an enlarged side view in FIG. 4B. In the example shown in FIGS. 4A and 4B, the latch member 19 is a projection formed from a side portion of the lead 14 to the upper surface of the lead 14, and latches the lead 14 by sandwiching the lead 14 from a side surface. The latch member 19 is made of the same material as the resin case 13, and is formed integrally with the bottom surface portion 13a of the resin case 13. The latch member 19 can be formed by transfer molding by providing a depressed portion corresponding to the latch member 19 in the die used when integrally forming the resin case 13 and lead 14 by transfer molding.

With regard to the position in which the latch member 19 is provided, it is preferable in terms of preventing floating of the lead 14 that the latch member is provided near the leading end in the direction of extension of the lead 14, but it is preferable that the position is such as not to interfere with the ultrasonic tool used when joining the bonding wire to the lead 14. Also, the latch member 19 is of an approximately cylindrical form, and the diameter and height from the lead surface of the cylinder, although depending on the width and thickness of the lead 14, the lead 14 interval, and the like, can each be in the region of 1 mm or less.

The latch member 19 is not limited to an example wherein one each is provided on either side of one lead 14. A plurality of latch members 19 can be provided in the direction of extension of one lead 14.

Figure 5A:
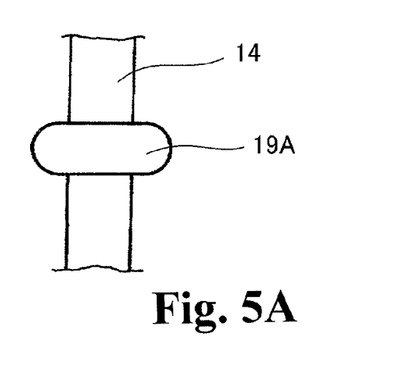
FIGS. 5A and 5B are illustrations of another example of a latch member.
Figure 5B:
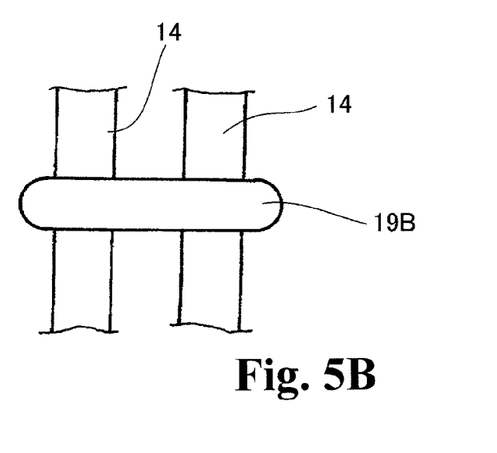

A modification example of a latch member is shown in plan view in FIGS. 5A and 5B. A latch member 19A shown in FIG. 5A is a latch member formed so as to cover the lead 14 in the width direction. A latch member 19B shown in FIG. 5B is a latch member formed so as to cover a plurality of lead 14 in the width direction.

It is possible to close contact the lead 14 with the bottom surface portion 13a of the resin case 13 using the latch members 19, 19A, and 19B, and thus possible to increase the reliability of the semiconductor device. Also, it is possible to prevent floating of the lead 14 when wire bonding, and therefore possible to increase reliability when bonding (wire bondability).

Next, a description will be given of another embodiment of the semiconductor device of the invention. In the embodiment, depressed portions 20 are provided along side portions of the lead 14 in positions other than that of the depressed portion 18 provided along the peripheral edge of the bottom surface portion 13a inside the resin case 13, specifically, in an intermediate point or leading edge portion of the lead in the direction of extension of the lead 14, as shown in FIGS. 1 and 3. The depressed portion 20 can be formed by a protruding portion corresponding to the depressed portion 20 being formed on the die used when integrally molding the resin case 13 and lead 14 by transfer molding.

By the depressed portions 20 being formed, the contact area of the resin case 13 and sealing resin 17 increases in comparison with a case in which the depressed portions 20 are not formed, because of which the resin case 13 is securely close contact the sealing resin 17 in the vicinity of the lead 14, meaning that it is possible to reduce the gap between a portion of the lead 14 in proximity to the depressed portion 20 and the resin case 13. Therefore, it is possible to prevent the ingress of moisture in this position. That is, by the depressed portion 18 and depressed portions 20 being formed, it is possible to doubly prevent the ingress of moisture.

Figure 6:
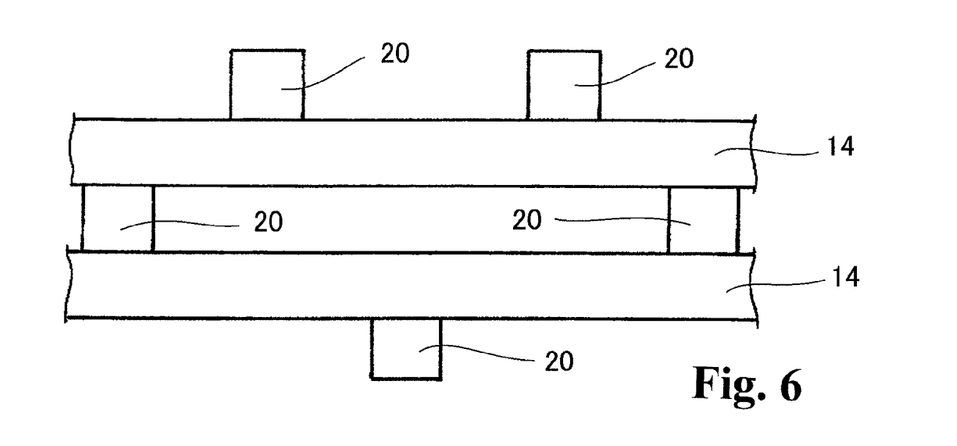
FIG. 6 is an enlarged view of a VI portion of FIG. 1.

An enlarged view of the vicinity of a VI portion of FIG. 1 is shown in FIG. 6 as a preferred example of positions in which the depressed portion 20 is provided. In FIG. 6, the plurality of lead 14 is extended in parallel on the bottom surface portion 13a of the resin case 13. The depressed portions 20 provided in the vicinity of these leads 14 are disposed staggered rather than being disposed aligned in the width direction of the lead 14. By the depressed portions being disposed staggered, it is possible to further improve the adhesion between the lead 14 and resin case 13.

A depressed portion formed inside the resin case 13 as the mark of a pin provided on the die for positioning the lead 14 when molding the resin case 13 by transfer molding can be used as it is as the depressed portion 20. In this case, there is no need for the trouble and cost of forming a protruding portion for providing the depressed portion 20 on the die, separately from the normal pin.

Next, a description will be given of another embodiment of the invention.

Figure 7:
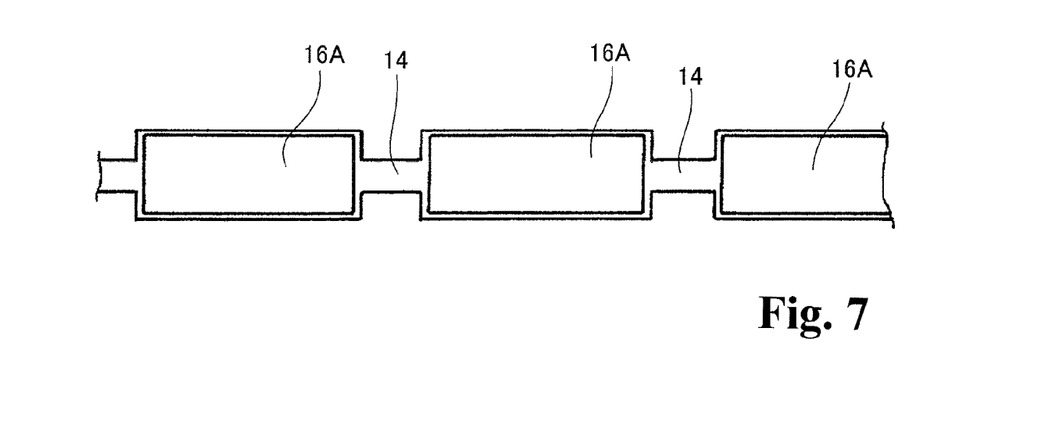
FIG. 7 is an enlarged view of a VII portion of FIG. 1.

FIG. 7 shows an enlarged view of a VII portion of FIG. 1. When a plurality of control circuit chips 16A is provided adjacent on the lead 14, the width of a portion of the lead 14 between the control circuit chips 16A is smaller than the width of a portion of the lead 14 on which the control chip 16A is mounted. By the width of the lead 14 between the control circuit chips 16A being smaller, it is possible to improve the adhesion between the bottom surface portion 13a of the resin case 13 and the lead 14 in comparison with when the width of the lead 14 is not smaller, and therefore possible to increase the reliability of the semiconductor device 10.

Next, a description will be given, using FIG. 8, of another embodiment of the invention.

Figure 8:
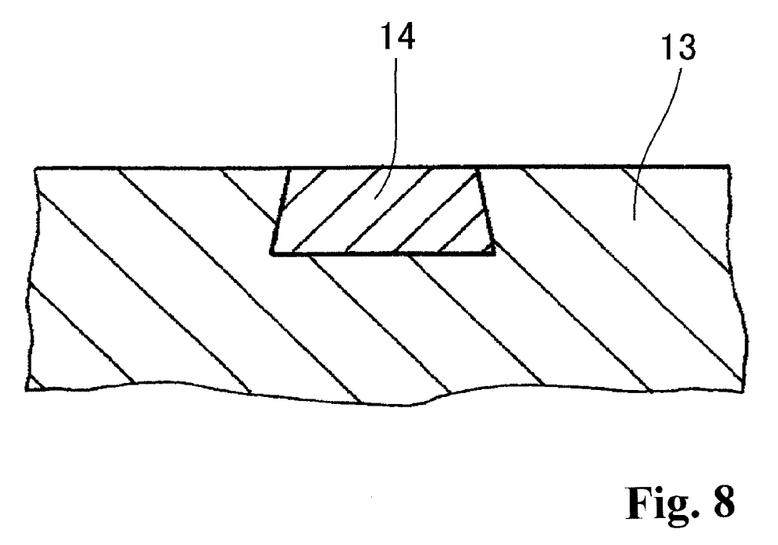
FIG. 8 is a schematic sectional view of a lead.

FIG. 8 is a schematic sectional view cut in a direction perpendicular to the direction of extension of the lead 14. The lead 14 is manufactured by a metal foil punching process. Due to the punching process, the lead 14 has a trapezoidal cross-section. The upper edge of the lead 14 with the trapezoidal cross-section, wherein the upper edge is smaller than the lower edge, is positioned in the surface of the bottom surface portion 13a of the resin case 13. Because of this, the lead 14 is unlikely to come out of the bottom surface portion 13a of the resin case 13, and it is thus possible to improve the adhesion between the lead 14 and resin case 13.

Figure 9A:
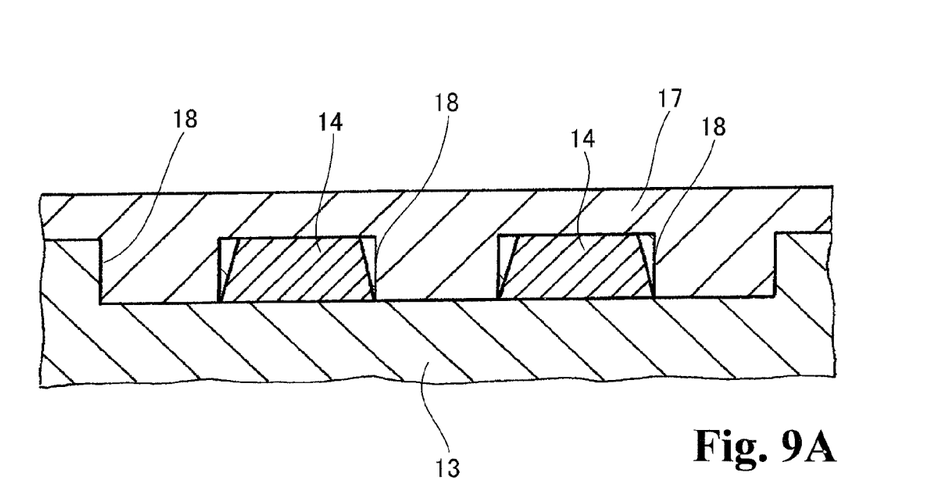
FIGS. 9A and 9B are schematic sectional views of the lead and periphery thereof.
Figure 9B:
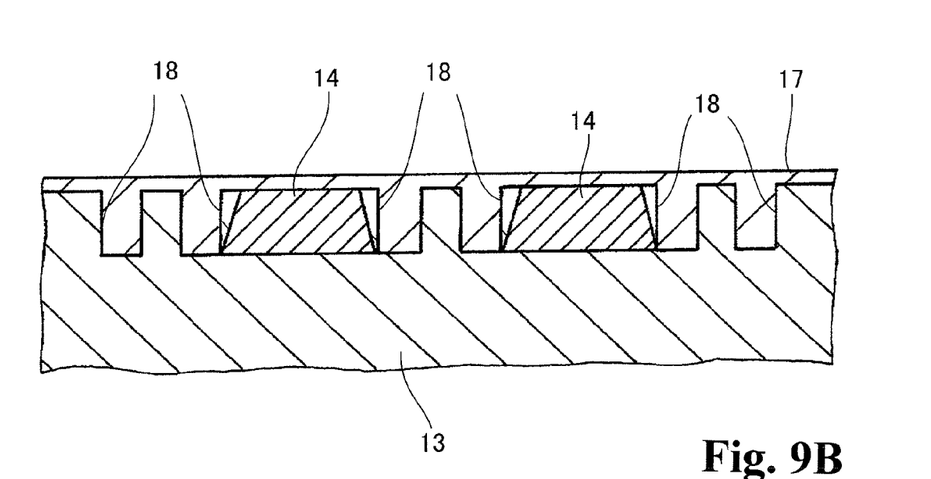

Also, FIGS. 9A and 9B are schematic sectional views cut in a direction perpendicular to the direction of extension of the lead 14 so as to include the depressed portion 18 formed along the peripheral edge of the bottom surface portion 13a inside the resin case 13. The lead 14, in the same way, has a trapezoidal cross-section.

As shown in FIG. 9A, the inclined surface on either side of the lead 14 is covered by the resin case 13 between the lead 14 and depressed portion 18. By bringing the sealing resin 17 into close contact with the side surfaces of the lead 14, sandwiching the resin of the resin case 13, it is possible to further prevent the ingress of moisture through the gap between the lead 14 and resin case 13. This is effective when there is little adhesion between the sealing resin 17 and lead 14. In FIG. 9A, two depressed portions 18 are formed so as to contact either side of one lead 14, with one depressed portion 18 being shared between neighboring leads 14. The depressed portion 18 may be formed for each lead 14 so as to contact either side of the lead 14, so that the plurality of depressed portion 18 is disposed between the leads 14, as shown in FIG. 9B. When neighboring leads 14 are distanced, it is possible to improve the adhesion between the resin case 13 and sealing resin 17. Also, in FIGS. 9A and 9B, the depressed portion 18 is formed so as to contact either side of the lead 14, but the depressed portion 18 may be also be disposed so as to contact only at least one side of the lead 14.

Embodiment

An investigation has been made with respect to resin adhesion evaluation and wire bondability for the semiconductor device 10 (the invention example) shown in FIGS. 1 and 2 and a semiconductor device (a comparison example) that, apart from not having the depressed portion 18 and latch member 19, is of the same configuration as the semiconductor device 10. The resin adhesion evaluation is such that a pressure cooker test is carried out on the semiconductor device 10 for 96 hours under testing conditions of 130° C., humidity of 85%, and pressure of 0.23 MPa, and evaluation is based on the presence or otherwise of resin detachment after the time elapses. Regarding the presence or otherwise of resin detachment, the adhesion condition at the resin interface is evaluated using an ultrasonic flaw detection method. Also, the wire bondability is evaluated based on the ratio of products in which the wire joint is good after wire bonding is carried out on the lead 14.

The result of the resin adhesion evaluation shows that whereas there is no resin detachment in the invention example, wherein the depressed portion 18 is formed on either side of the lead 14 along the peripheral edge of the bottom surface portion 13a inside the resin case 13, resin detachment is observed in the comparison example, wherein the depressed portion 18 is not formed.

The result of the wire bondability evaluation shows that whereas the ratio of products in which the wire joint is good is 100% for the invention example, which has the latch member 19, the ratio of products in which the wire joint is good is 95% for the comparison example, which does not have the latch member 19.

What is claimed is:

1. A semiconductor device, comprising:
   an insulating circuit substrate mounted with at least one semiconductor element;
   a resin case having a bottom surface portion attached with the insulating circuit substrate and a side surface portion enclosing a periphery of the bottom surface portion;
   a plurality of leads molded integrally with the resin case and provided parallel around a periphery of the insulating circuit substrate, the plurality of leads being positioned in the bottom surface portion inside the resin case so that an upper surface of the lead and a surface of the bottom surface portion are coplanar, and penetrating the side surface portion of the resin case to extend from inside the resin case to outside the resin case; and
   a sealing resin filled inside the resin case,
   wherein the resin case includes depressed portions formed in the bottom surface portion on each of two sides of each of the plurality of leads along a border between the bottom surface portion and the side surface portion to fill with the sealing resin.

2. The semiconductor device according to claim 1, further comprising: another depressed portion formed in one of two sides of at least one of the leads in a position other than that of the depressed portions inside the resin case.

3. The semiconductor device according to claim 2, wherein the another depressed portion includes further depressed portions formed in the two sides of the at least one lead disposed to be staggered along an extending direction of the plurality of leads.

4. The semiconductor device according to claim 2, wherein at least one of the depressed portions is a mark of a pin from a molding die.

5. The semiconductor device according to claim 1, wherein at least one of the plurality of leads includes portions to mount a control circuit chip, and a width of the lead between the portions is narrower than a width of the portions of the lead mounted with the control circuit chip.

6. The semiconductor device according to claim 1, wherein at least one of the plurality of leads has a trapezoidal shape wherein an upper edge is smaller than a lower edge in a cross-section perpendicular to an extending direction, and the upper edge is positioned on the surface of the bottom surface portion inside the resin case.

7. The semiconductor device according to claim 1, wherein the resin case is made of one kind of resin selected from the group consisting of a polyphenylene sulfide resin, a polybutylene terephthalate resin, a polyamide resin, or an acrylonitrile butadiene styrene resin.

8. The semiconductor device according to claim 1, wherein one depressed portion is located between two leads adjacent to each other.

9. A semiconductor device, comprising:
   an insulating circuit substrate mounted with at least one semiconductor element;
   a resin case having a bottom surface portion attached with the insulating circuit substrate and a side surface portion enclosing a periphery of the bottom surface portion;
   a plurality of leads molded integrally with the resin case and provided parallel around a periphery of the insulating circuit substrate, the plurality of leads being positioned in a plane same as a surface of the bottom surface portion inside the resin case, and penetrating the side surface portion to extend from inside the resin case to outside the resin case; and
   a sealing resin filled inside the resin case,
   wherein the resin case includes a depressed portion formed in the bottom surface portion on each of two sides of each of the plurality of leads along a border between the bottom surface portion and the side surface portion to fill with the sealing resin, and a latch member provided on the bottom surface portion in a position other than that of the depressed portion, protruding from the surface of the bottom surface portion and crossing at least partially above a portion of at least one lead of the plurality of leads in a longitudinal direction thereof to latch the one lead.

10. The semiconductor device according to claim 9, wherein the latch member is a projection formed from a side portion of the lead to an upper surface of the lead.

11. The semiconductor device according to claim 9, wherein the latch member is made of a material same as the resin case, and is molded integrally with the resin case.

12. The semiconductor device according to claim 9, wherein the latch portion extends across at least two leads of the plurality of leads.

* * * * *